(12) United States Patent
Chan et al.

(10) Patent No.: US 7,539,912 B2
(45) Date of Patent: May 26, 2009

(54) METHOD AND APPARATUS FOR TESTING A FULLY BUFFERED MEMORY MODULE

(75) Inventors: Hong Liang Chan, Markham (CA); Allen Lawrence, Round Rock, TX (US); Sunny Chang, Markham (CA); Joseph C. Klein, Austin, TX (US); Bosco Lai, Markham (CA)

(73) Assignee: King Tiger Technology, Inc., Austin, TX (US)

( * ) Notice: Subject to any disclaimer, the term of this patent is extended or adjusted under 35 U.S.C. 154(b) by 347 days.

(21) Appl. No.: 11/611,390

(22) Filed: Dec. 15, 2006

(65) Prior Publication Data

US 2007/0140025 A1 Jun. 21, 2007

Related U.S. Application Data

(60) Provisional application No. 60/750,286, filed on Dec. 15, 2005.

(51) Int. Cl.
*G11C 29/00* (2006.01)
(52) U.S. Cl. .................................................. 714/718
(58) Field of Classification Search .................. None
See application file for complete search history.

(56) References Cited

U.S. PATENT DOCUMENTS

| | | | |
|---|---|---|---|
| 4,379,259 A | 4/1983 | Varadi et al. |
| 4,484,329 A | 11/1984 | Slamka et al. |
| 4,821,238 A | 4/1989 | Tatematsu |
| 4,965,799 A | 10/1990 | Green et al. |
| 5,794,175 A | 8/1998 | Conner |
| 5,959,914 A | 9/1999 | Gates et al. |
| 5,995,424 A | 11/1999 | Lawrence et al. |
| 6,014,759 A | 1/2000 | Manning |
| 6,055,653 A | 4/2000 | LeBlanc et al. |

(Continued)

FOREIGN PATENT DOCUMENTS

WO   WO 02/29824   4/2002

OTHER PUBLICATIONS

Jedec, "Fully Buffered DIMM (FBD): Design for Test, Design for Validation (DFx) Specification," Revision 0.5, Jul. 2004, pp. 1-90.

(Continued)

*Primary Examiner*—Christine T Tu
(74) *Attorney, Agent, or Firm*—K&L Gates LLP

(57) ABSTRACT

Described embodiments relate to a method of testing fully buffered memory modules that involves placing a buffer device, a test vectors generator, and a switch into a memory device tester, coupling the buffer device and the test vectors generator to the switch inside the tester, coupling the switch to an identical buffer device that is located on a memory module with plurality of DRAM devices, and testing the plurality of DRAM devices and the buffer device of the memory module. An apparatus implementing the method comprises a memory device tester, a memory bus, and a plurality of memory modules under test, the tester and the plurality of memory modules connected to the memory bus in a point-to-point manner, the tester comprising a buffer device, a test vectors generator, and a switch, the tester connected to the memory bus through the switch, each memory module under test having a plurality of DRAM devices and an identical buffer device.

22 Claims, 3 Drawing Sheets

U.S. PATENT DOCUMENTS

| | | |
|---|---|---|
| 6,055,661 A | 4/2000 | Luk |
| 6,058,055 A | 5/2000 | Brunelle |
| 6,178,526 B1 | 1/2001 | Nguyen et al. |
| 6,189,121 B1 * | 2/2001 | Ogawa .................... 714/733 |
| 6,275,962 B1 | 8/2001 | Fuller et al. |
| 6,345,372 B1 | 2/2002 | Dieckmann et al. |
| 6,389,525 B1 | 5/2002 | Reichert et al. |
| 6,425,095 B1 | 7/2002 | Yasui |
| 6,452,411 B1 | 9/2002 | Miller et al. |
| 6,574,759 B1 | 6/2003 | Woo et al. |
| 6,646,936 B2 | 11/2003 | Hamamatsu et al. |
| 6,701,474 B2 | 3/2004 | Cooke et al. |
| 6,754,117 B2 | 6/2004 | Jeddeloh |
| 6,996,749 B1 | 2/2006 | Bains et al. |
| 7,073,100 B2 * | 7/2006 | Chadwick et al. .......... 714/718 |
| 2006/0195742 A1 * | 8/2006 | Jung et al. ................ 714/733 |

OTHER PUBLICATIONS

Mazumder, Pinaki and Chakraborty, Kanad, "Testing and Testable Design of High-Density Random-Access Memories," Kluwer Academic Publishers, Boston, 1996, pp. 45-71, 75-127, 221-331.

Sharma, Ashok K., "Semiconductor Memories: Technology, Testing, and Reliability," IEEE, John Wiley & Sons Inc., NY, 1997, pp. 140-194.

* cited by examiner

METHOD AND APPARATUS FOR TESTING A FULLY BUFFERED MEMORY MODULE

CROSS REFERENCE TO RELATED APPLICATIONS

This application claims priority to, and the benefit of, U.S. Provisional Patent Application Ser. No. 60/750,286 filed on Dec. 15, 2005, the entire contents of which is hereby incorporated by reference.

TECHNICAL FIELD

The present invention relates generally to methods and apparatus for testing of integrated circuit devices. More particularly, it relates to testing memory organized in fully buffered memory modules, such as dual in-line memory modules (DIMM), where there are no direct connections between an edge connector on the DIMM and the dynamic random access memory (DRAM) devices that reside on the DIMM.

BACKGROUND

Integrated circuit devices are typically subject to rigorous testing before they are sold or put to their intended use. For example, each integrated circuit device is tested to determine whether or not it meets the specifications for that type of device as determined by the manufacturer.

One example of an integrated circuit device, which is tested prior to its use in commercial applications, is a memory module. Memory modules are subject to testing to determine whether they meet the specifications for those types of devices as specified by the manufacturer. Memory devices are subjected to such tests as pattern testing and parametric tests. Pattern testing of memory devices is an organized method of exercising each memory cell in a memory device to verify its functionality. On the other hand, parametric tests verify operating parameters such as power consumption, standby current, leakage current, voltage levels, and access time.

For testing a fully buffered DIMM, it is necessary to test DRAM devices and a buffer device that both reside on the DIMM. Testing the DRAM devices may be conventionally done by applying a transparent mode of operation of the buffer device, for example as described in U.S. Pat. No. 6,996,749 to Bains et al., the entire contents of which is hereby incorporated by reference. In the transparent mode of operation, the buffer device passes memory commands to individual DRAM devices through a reserve path and verifies the functionalities of the DRAM devices.

Testing the buffer device itself is done by applying a normal mode of operation in which mode the high-speed serial interface of the buffer device is employed and tested.

A problem associated with conventional testing of fully buffered memory modules is that testing of DRAM devices and testing of the buffer device has to be done in separate places. Conventional testing of a fully buffered memory module employs either a tester with two separate testing slots (a first slot for testing a buffer device under a normal mode of operation and a second slot for testing DRAM devices under a transparent mode of operation) or two different testers (first tester for testing a buffer device under a normal mode of operation and a second tester for testing DRAM devices under a transparent mode of operation). This arrangement complicates and lengthens the testing process because it requires two insertions of the memory module into separate testing slots and it also can cause wear on the contacts of the memory modules.

SUMMARY

Certain embodiments relate to a method of testing a fully buffered memory module having a first buffer device and a plurality of dynamic random access memory (DRAM) devices. The method comprises: coupling a memory tester to the memory module, the memory tester comprising a second buffer device, a test vectors generator and a switch, wherein the switch is coupled to the second buffer device, to the test vectors generator and to the first buffer device; operating the switch in a first state to couple the second buffer device to the first buffer device and using the second buffer device to test the first buffer device; and operating the switch in a second state to couple the test vectors generator to the first buffer device and using the test vectors generator to test the DRAM devices via the first buffer device.

The switch may enable high-speed communication between the first and second buffer devices. The switch may enable low speed communication between the test vectors generator and the DRAM devices. The memory tester may be coupled to the memory module via point-to-point topology.

The fully buffered memory module may be a first fully buffered memory module and may be connected in series with a second fully buffered memory module, whereby the first buffer device is coupled to a third buffer device of the second memory module, and wherein the method further comprises: operating the switch in the first state to couple the second buffer device to the third buffer device via the first buffer device and using the second buffer device to test the third buffer device; operating the switch in the second state to couple the test vectors generator to the third buffer device via the first buffer device and using the test vectors generator to test DRAM devices of the second memory module.

The test vectors generator may comprise a field programmable gate array (FPGA), an application-specific integrated circuit, or a special-purpose processor.

Further embodiments relate to a memory device tester, comprising: a controller; a first buffer device responsive to the controller; a test vectors generator responsive to the controller; and a switch coupled to the first buffer device and the test vectors generator and responsive to the controller. The switch has an output coupleable to a second buffer device of a fully buffered memory module and is switchable between a first state in which the first buffer device is coupled to the output and a second state in which the test vectors generator is coupled to the output.

The test vectors generator may comprise a field programmable gate array (FPGA), an application-specific integrated circuit or a special purpose processor. The switch may be operable to allow high-speed communication between the second and first buffer devices in the first state.

Further embodiments relate to a system for testing fully buffered memory modules. The system comprises a memory device tester, comprising: a controller, a first buffer device responsive to the controller, a test vectors generator responsive to the controller, and a switch coupled to the first buffer device and the test vectors generator and responsive to the controller. The switch has an output and is switchable between a first state in which the first buffer device is coupled to the output and a second state in which the test vectors generator is coupled to the output. The system further comprises a memory bus coupled to the output of the switch; and at least one fully buffered memory module, each memory module comprising a second buffer device coupled to the memory bus and a plurality of dynamic random access memory (DRAM) devices coupled to the second buffer device. The controller is configured to control the switch to sequentially adopt the first state and the second state to test the second buffer device and the plurality of DRAM devices, respectively, or each of at least one memory module.

The at least one memory module may comprise a plurality of memory modules coupled to the memory bus. The first buffer device may be identical to the second buffer device. The switch may enable high-speed communication between the first and second buffer devices. The switch may enable low speed communication between the test vectors generator and the DRAM devices. The memory bus may be coupled to each second buffer device and to the output of the switch via point-to-point topology. The test vectors generator may comprise a field programmable gate array (FPGA), an application-specific integrated circuit or a special-purpose processor.

Additional features and advantages are described herein, and will be apparent from, the following Detailed Description and the figures.

BRIEF DESCRIPTION OF THE DRAWINGS

Embodiments are described in further detail below, by way of example, with reference to the accompanying drawings, in which.

DETAILED DESCRIPTION

The described embodiments are applicable to methods and apparatus for testing the memory modules of integrated circuit devices. Testing is performed for fully buffered memory modules in an environment suitable for testing both the DRAM devices and the buffer device of each memory module.

Figure 1:
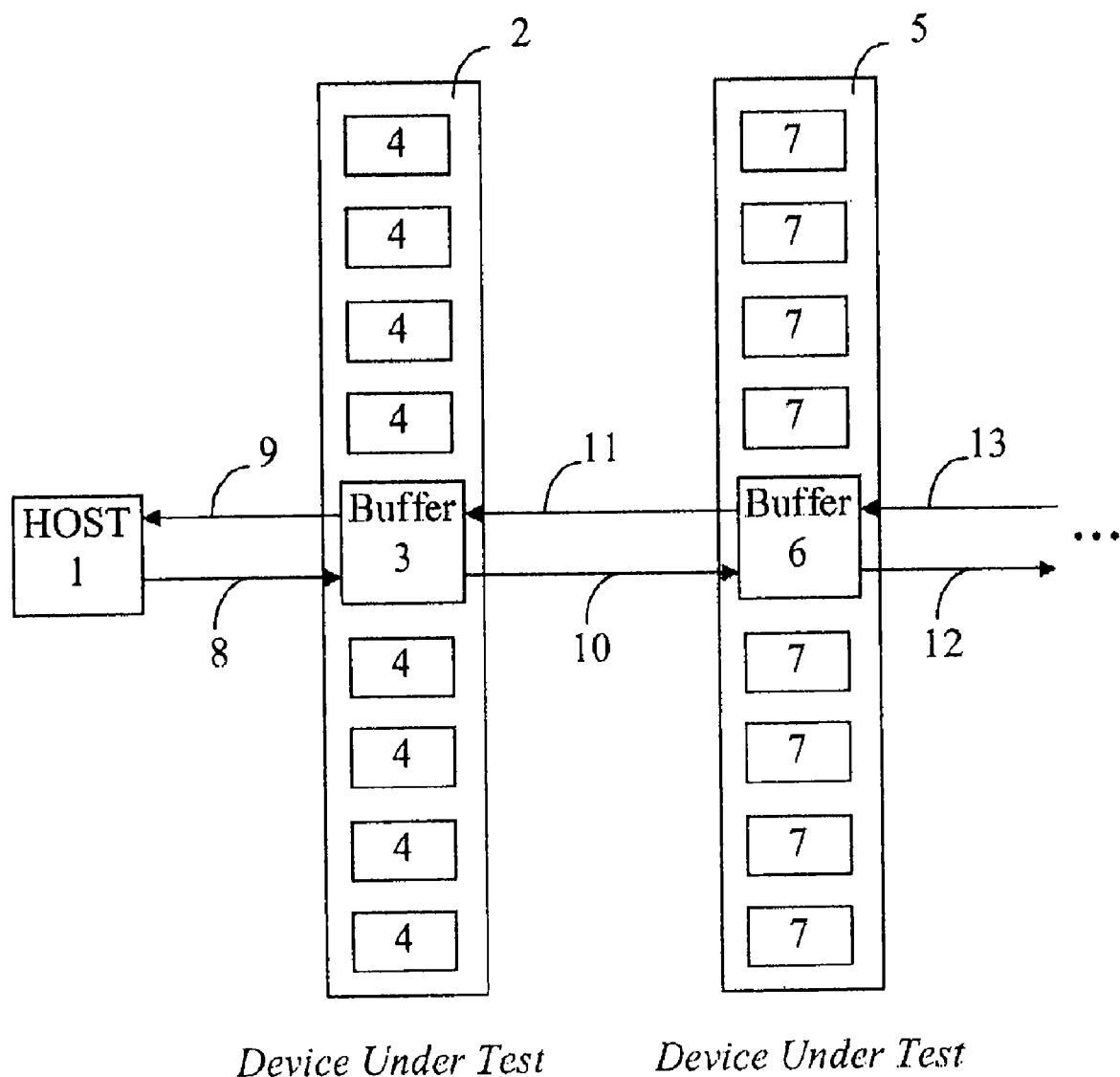
FIG. 1 shows a Prior Art arrangement for testing of Fully Buffered Memory Modules.

FIG. 1 illustrates a conventional arrangement for testing of fully buffered memory modules. The conventional arrangement contains a Host 1, which is connected with a plurality of Devices Under Test 2, 5 and so on, where each Device Under Test represents a fully buffered memory module.

Each fully buffered dual in-line memory module (DIMM) has the buffer device and a plurality of DRAM devices. For example, in FIG. 1 DIMM 2 contains the buffer device 3 and a plurality of DRAM devices 4, and DIMM 5 contains the buffer device 6 and a plurality of DRAM devices 7.

All memory modules are connected with Host 1 via point-to-point topology. Host 1 is directly connected with the buffer device 3 of the first DIMM 2 through a memory bus (where connection 8 is for an outbound data stream, and connection 9 is for an inbound data stream). Thus, connection of Host 1 with DRAM devices 4 of the first DIMM 2 is achieved through the memory bus and the buffer device 3.

Buffer device 3 of DIMM 2 is directly connected with the buffer device 6 of the second DIMM 5 through a memory bus (where connection 10 is for an outbound data stream, and connection 11 is for an inbound data stream). Thus, connection of Host 1 with DRAM devices 7 of the second DIMM 5 is achieved via memory bus and the buffer devices 3 and 6.

Conventional testing of fully buffered memory modules doesn't allow testing of the buffer device and DRAM devices of fully buffered memory modules to be performed through a single insertion. Conventional testing of the buffer device and DRAM devices of a fully buffered memory module is performed either by a tester with two separate testing slots or by two different testers.

Figure 2:
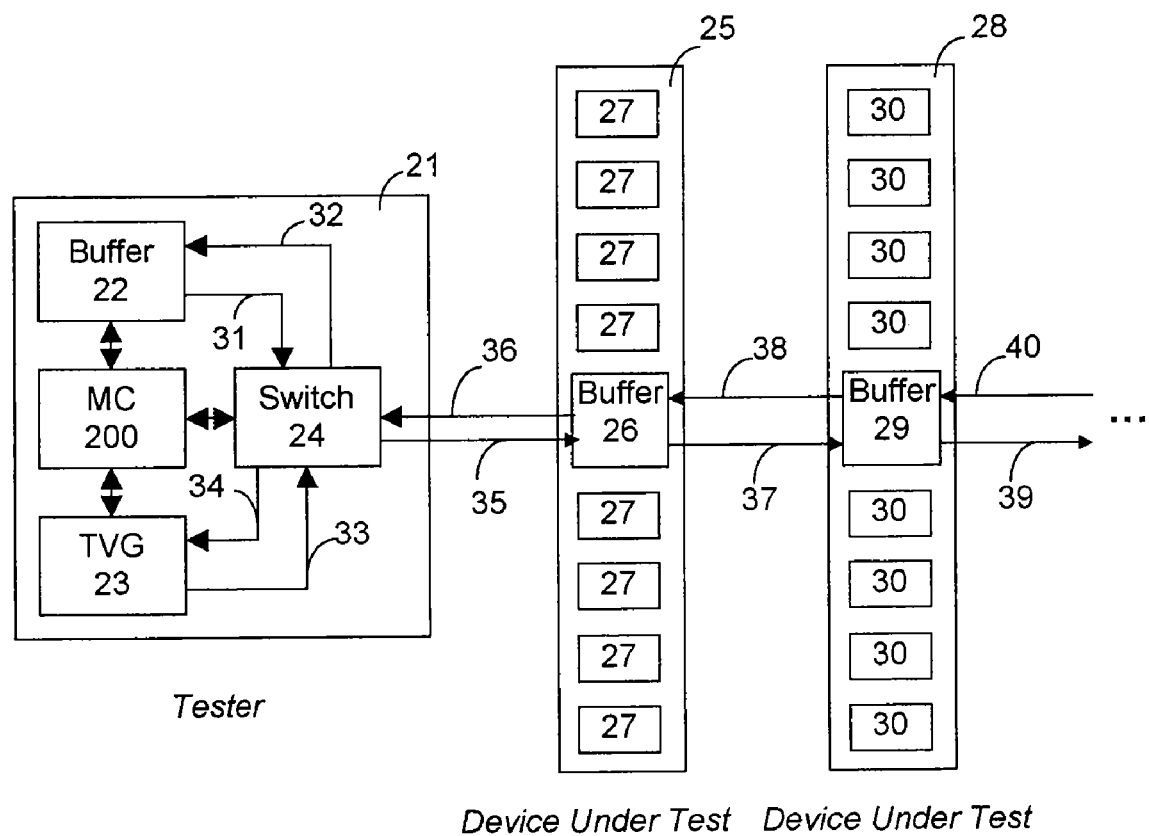
FIG. 2 shows an arrangement for testing of Fully Buffered Memory Modules according to some embodiments of the invention.

FIG. 2 illustrates an improved memory tester apparatus for testing of fully buffered memory modules. The improved memory tester apparatus comprises a Tester 21, which is connected with plurality of Devices Under Test 25, 28 and so on, where each Device Under Test represents a fully buffered DIMM. Each fully buffered DIMM has a buffer device and a plurality of DRAM devices. As shown in FIG. 2, DIMM 25 contains a buffer device 26 and a plurality of DRAM devices 27, and DIMM 28 contains a buffer device 29 and a plurality of DRAM devices 30.

All memory modules are connected with Tester 21 via point-to-point topology. In this way, tester 21 is connected with the first DIMM, which is connected to the next DIMM, and so on.

Tester 21 comprises a microcontroller 200 (MC), a buffer device 22, Test Vectors Generator 23, and a Switch 24. Buffer device 22 is connected with Switch 24, where connection 31 is for an outbound data stream (from buffer device 22), and connection 32 is for an inbound data stream (to buffer device 22). Similarly Test Vectors Generator 23 is connected with Switch 24, where connection 33 is for an outbound data stream (from Test Vectors Generator 23), and connection 34 is for an inbound data stream (to Test Vectors Generator 23). Microcontroller 200 is coupled to buffer device 22, Test Vector Generator 23, and Switch 24 to control the testing procedure. Microcontroller 200 may be substituted for any suitable form of processing device, including, but not limited to, an FPGA.

Figure 3:
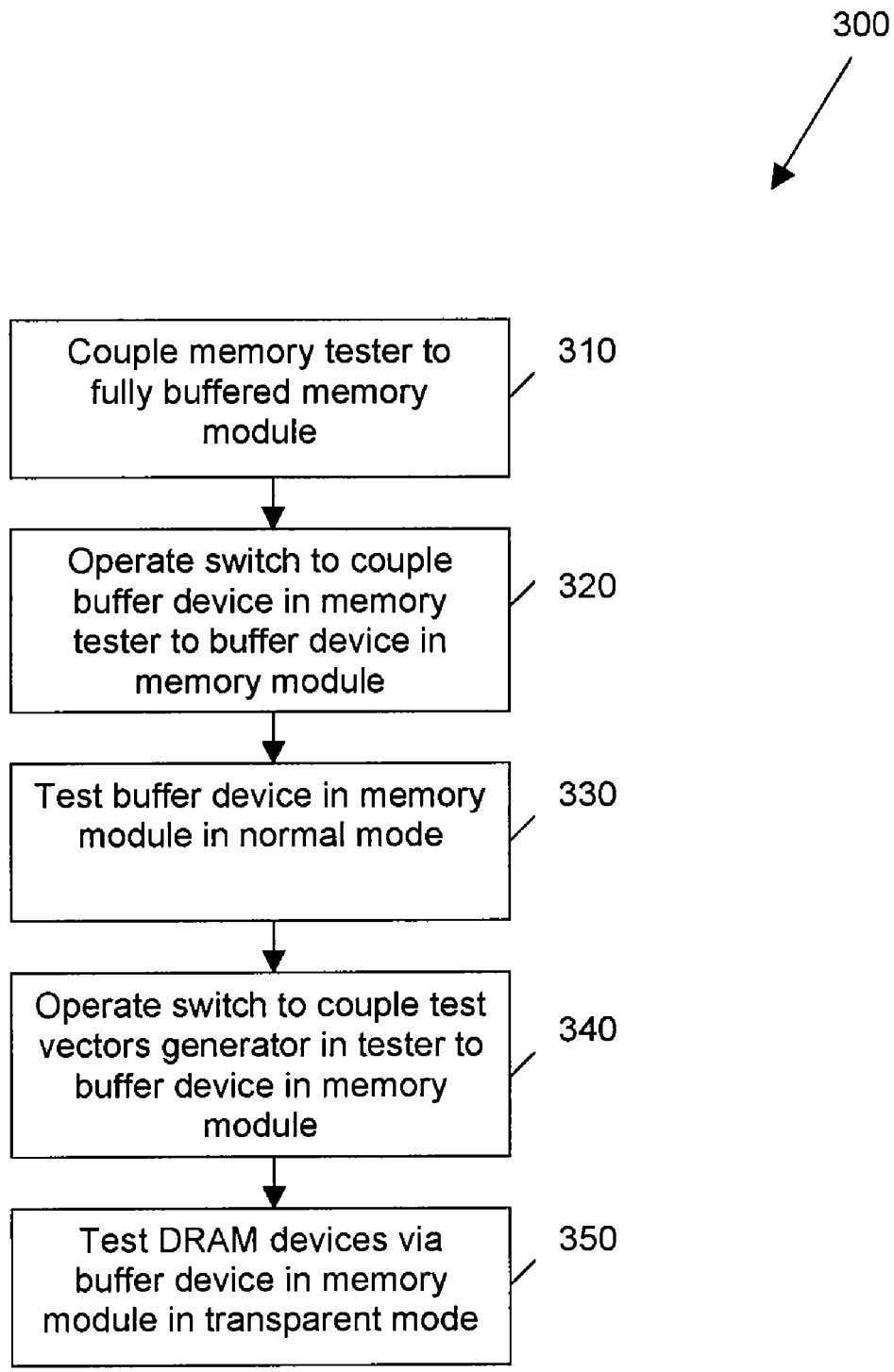
FIG. 3 is a flowchart of a method of testing fully buffered memory modules according to further embodiments of the invention.

Tester 21 further comprises a memory (not shown) accessible to microcontroller 200 that stores program code executable by the microcontroller to carry out the testing procedure, for example as illustrated in FIG. 3 and described in relation thereto.

Switch 24 of Tester 21 is directly connected with buffer device 26 of the first DIMM 25 through a memory bus (where 35 is outbound data stream, and 36 is inbound data stream). Therefore connection of Tester 21 with DRAM devices 27 of the first DIMM 25 is achieved through memory bus and the buffer device 26. An example of a suitable Switch 24 may be a high speed switch such as that made by Analog Devices, Inc. of Norwood, Mass. under the product code ADG918.

Consecutively buffer device 26 of DIMM 25 is directly connected with the buffer device 29 of the second DIMM 28 through memory bus (where connection 37 is for an outbound data stream, and connection 38 is for an inbound data stream). Hence connection of Tester 21 with DRAM devices 30 of the second DIMM 28 is achieved via memory bus and the buffer devices 26 and 29. Further connections 39 and 40 may be made for outbound and inbound data streams respectively to and from a further device under test (not shown).

Buffer device 22 of Tester 21 serves to perform testing of high-speed connections of buffer devices 26 and 29 of memory modules 25 and 28, respectively. Buffer device 22 runs an internal built-in self-test (BIST) program that tests the high-speed serial interface of buffer devices 26 and 29. Testing of buffer devices 26 and 29 is done during a normal mode of operation via Switch 24 operating at high speed, during which the high-speed serial interface of the buffer devices 26 and 29 is employed and tested. Thus, Switch 24 enables connection of buffer device 22 with buffer device 26 of memory module 25 and isolates Test Vectors Generator 23 from buffer device 26.

Similarly, Test Vectors Generator 23 of Tester 21 serves to perform testing of a plurality of DRAM devices 27 and 30 of memory modules 25 and 28 respectively. Test Vectors Generator 23 generates test patterns that test the functionalities of DRAM devices 27 and 30. Switch 24 enables connection of Test Vectors Generator 23 with DRAM devices 27 via buffer device 26 of memory module 25 and isolates buffer device 22 from buffer device 26. Testing of DRAM devices 27 and 30 is done during a transparent mode of operation with the help of Switch 24 passing through low-speed signals from Test Vectors Generator 23; during transparent mode the buffer devices 26 and 29 pass memory commands to DRAM devices 27 and 30 through reserve paths to verify functionalities of DRAM devices 27 and 30. Electrical characteristics of high-speed Switch 24 are chosen in such way that Switch 24 passes through both high-speed and low-speed signals undistorted.

The described embodiments simplify the testing of fully buffered memory modules by allowing testing of DRAM devices and testing of the buffer device using a single tester because the high-speed switch 24 of memory tester 21 permits changing between the normal and transparent modes of operation of the memory tester 21. An internal built-in self-test (BIST) program used during normal testing modes is described in an industry specification for fully buffered DIMMs by the JEDEC Solid State Technology Association. Numerous testing patterns that are produced by Test Vectors Generator 23 are described in Pinaki Mazumder and Kanad Chakraborty, "Testing and testable design of high-density random-access memories," Kluwer Academic Publishers, Boston, 1996, pp. 45-71, 75-154, and 221-331 and Ashok K. Sharma, "Semiconductor memories: technology, testing, and reliability," IEEE, John Wiley & Sons Inc., NY, 1997, pp. 140-194. Transparent modes, which use testing patterns produced by Test Vectors Generator 23, are described by Bains et al. in U.S. Pat. No. 6,996,749.

Referring now to FIG. 3, a method 300 of testing fully buffered memory modules is described in further detail. Method 300 begins at step 310, at which memory tester 21 is coupled to a fully buffered memory module, such as Device Under Test 25, which, as shown in FIG. 2, is coupled with at least one further Device Under Test 28.

At step 320, microcontroller 200 operates Switch 24 to couple buffer device 22 to buffer device 26 in Device Under Test 25. At step 330, microcontroller 200 tests buffer device 26 using buffer device 22 in a normal mode of operation, where Switch 24 is in a first switched state. In the first switched state, high-speed communication between buffer device 22 and buffer device 26 is enabled via connections 31, 35, 36 and 32 and the Test Vectors Generator 23 is isolated.

Once testing of buffer device 26 is completed, microcontroller 200 causes switch 24 to adopt a second state at step 340, in which Test Vectors Generator 23 is coupled to buffer device 26 via connections 33, 34, 35, and 36. In the second state of switch 24, buffer device 22 is isolated.

In step 350, microcontroller 200 controls Test Vectors Generator 23 to test the DRAM devices 27 via buffer device 26 in memory module 25 in a transparent mode of testing.

To the extent that any defects in memory module 25 are detected during testing of buffer device 26 or DRAM devices 27, these are recorded by microcontroller 200 in memory for subsequent reporting.

Steps 330 to 350 are repeated for each subsequent device under test, such as memory module 28, that is coupled to memory device tester 21 via the memory bus.

Embodiments of the invention have been shown and described by way of example. It will be apparent to those skilled in the art that changes and modifications to the described embodiments may be made without departing from the spirit and scope of the described embodiments, as set out in the appended claims.

The invention is claimed as follows:

1. A method of testing a fully buffered memory module having a first buffer device and a plurality of dynamic random access memory (DRAM) devices, the method comprising:
   coupling a memory tester to the memory module, the memory tester comprising a second buffer device, a test vectors generator and a switch, wherein the switch is coupled to the second buffer device, to the test vectors generator and to the first buffer device;
   operating the switch in a first state to couple the second buffer device to the first buffer device and using the second buffer device to test the first buffer device; and
   operating the switch in a second state to couple the test vectors generator to the first buffer device and using the test vectors generator to test the DRAM devices via the first buffer device.

2. The method of claim 1, wherein the switch enables high-speed communication between the first and second buffer devices.

3. The method of claim 1, wherein the switch enables low speed communication between the test vectors generator and the DRAM devices.

4. The method of claim 1, wherein the memory tester is coupled to the memory module via point-to-point topology.

5. The method of claim 1, wherein the fully buffered memory module is a first fully buffered memory module and is connected in series with a second fully buffered memory module, whereby the first buffer device is coupled to a third buffer device of the second memory module, and wherein the method further comprises:
   operating the switch in the first state to couple the second buffer device to the third buffer device via the first buffer device and using the second buffer device to test the third buffer device; and
   operating the switch in the second state to couple the test vectors generator to the third buffer device via the first buffer device and using the test vectors generator to test DRAM devices of the second memory module.

6. The method of claim 1, wherein the test vectors generator comprises a field programmable gate array (FPGA).

7. The method of claim 1, wherein the test vectors generator comprises an application-specific integrated circuit.

8. The method of claim 1, wherein the test vectors generator comprises a special-purpose processor.

9. A memory device tester comprising:
   a controller;
   a first buffer device responsive to the controller;
   a test vectors generator responsive to the controller; and
   a switch coupled to the first buffer device and the test vectors generator and responsive to the controller, the switch having an output coupleable to a second buffer device of a fully buffered memory module and being switchable between a first state in which the first buffer device is coupled to the output and a second state in which the test vectors generator is coupled to the output.

10. The memory device tester of claim 9, wherein the test vectors generator comprises a field programmable gate array (FPGA).

11. The memory device tester of claim 9, wherein the test vectors generator comprises an application-specific integrated circuit.

12. The memory device tester of claim 9, wherein the test vectors generator comprises a special-purpose processor.

13. The memory device tester of claim 9, wherein the switch is operable to allow high-speed communication between the second and first buffer devices in the first state.

14. A system for testing fully buffered memory modules, the system comprising:
   a memory device tester, comprising:
      a controller,
      a first buffer device responsive to the controller,
      a test vectors generator responsive to the controller, and
      a switch coupled to the first buffer device and the test vectors generator and responsive to the controller, the switch having an output and being switchable between a first state in which the first buffer device is coupled to the output and a second state in which the test vectors generator is coupled to the output;
   a memory bus coupled to the output of the switch; and
   at least one fully buffered memory module, each memory module comprising a second buffer device coupled to the memory bus and a plurality of dynamic random access memory (DRAM) devices coupled to the second buffer device;
   wherein the controller is configured to control the switch to sequentially switch to the first state and the second state to test the second buffer device and the plurality of DRAM devices, respectively, of each at least one memory module.

15. The system of claim 14, wherein the at least one memory module comprises a plurality of memory modules coupled to the memory bus.

16. The system of claim 14, wherein the first buffer device is identical to the second buffer device.

17. The system of claim 14, wherein the switch enables high-speed communication between the first and second buffer devices.

18. The system of claim 14, wherein the switch enables low speed communication between the test vectors generator and the DRAM devices.

19. The system of claim 14, wherein the memory bus is coupled to each second buffer device and to the output of the switch via point-to-point topology.

20. The system of claim 14, wherein the test vectors generator comprises a field programmable gate array (FPGA).

21. The system of claim 14, wherein the test vectors generator comprises an application-specific integrated circuit.

22. The system of claim 14, wherein the test vectors generator comprises a special-purpose processor.

* * * * *